(12) United States Patent
Koike

(10) Patent No.: US 11,769,714 B2
(45) Date of Patent: Sep. 26, 2023

(54) SEMICONDUCTOR DEVICE WITH SEMICONDUCTOR CHIP MOUNTED ON DIE PAD AND LEADS OF LEAD FRAME

(71) Applicants: Kabushiki Kaisha Toshiba, Tokyo (JP); Toshiba Electronic Devices & Storage Corporation, Tokyo (JP)

(72) Inventor: Daisuke Koike, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/367,560

(22) Filed: Jul. 5, 2021

(65) Prior Publication Data

US 2022/0077027 A1 Mar. 10, 2022

(30) Foreign Application Priority Data

Sep. 8, 2020 (JP) ................................ 2020-150570

(51) Int. Cl.
*H01L 23/495* (2006.01)
*H01L 23/00* (2006.01)

(52) U.S. Cl.
CPC .... *H01L 23/49513* (2013.01); *H01L 23/4952* (2013.01); *H01L 23/49541* (2013.01);
(Continued)

(58) Field of Classification Search
CPC ......... H01L 24/29; H01L 24/45; H01L 24/46; H01L 24/83; H01L 23/49513;
(Continued)

(56) References Cited

U.S. PATENT DOCUMENTS

| 5,846,851 A | 12/1998 | Sasaki et al. |
| 6,677,663 B1 * | 1/2004 | Ku .................... H01L 23/49541 |
| | | 257/676 |

(Continued)

FOREIGN PATENT DOCUMENTS

| JP | S62-296541 A | 12/1987 |
| JP | H03-259982 A | 11/1991 |

(Continued)

*Primary Examiner* — Alonzo Chambliss
(74) *Attorney, Agent, or Firm* — Knobbe, Martens, Olson & Bear, LLP

(57) ABSTRACT

Provided is a semiconductor device including: a bed having a bed surface; a semiconductor chip having a bottom surface larger than the bed surface, the semiconductor chip being provided such that a center of the bottom surface is disposed above the bed surface and the bottom surface having a first end and a second end; a joint material provided between the bed surface and the bottom surface; a plate-like first wire having a first surface and provided such that the first surface faces the first end; a plate-like second wire having a second surface and provided such that the second surface faces the second end; a first insulating film having a third surface and a fourth surface provided on an opposite side of the third surface, the third surface being in contact with the first end, the fourth surface being in contact with the first surface; and a second insulating film having a fifth surface and a sixth surface provided on an opposite side of the fifth surface, the fifth surface being in contact with the second end, the sixth surface being in contact with the first surface.

22 Claims, 5 Drawing Sheets

(52) U.S. Cl.
CPC ........ *H01L 23/49582* (2013.01); *H01L 24/29* (2013.01); *H01L 24/46* (2013.01); *H01L 2224/29139* (2013.01)

(58) Field of Classification Search
CPC ........... H01L 23/4952; H01L 23/49582; H01L 23/49541; H01L 23/49586; H01L 2924/181; H01L 24/49
See application file for complete search history.

(56) References Cited

U.S. PATENT DOCUMENTS

| | | | | |
|---|---|---|---|---|
| 6,750,546 | B1* | 6/2004 | Villanueva | H01L 23/3107 |
| | | | | 257/772 |
| 2002/0093087 | A1* | 7/2002 | Paek | H01L 23/49548 |
| | | | | 257/690 |
| 2005/0275089 | A1* | 12/2005 | Joshi | H01L 24/48 |
| | | | | 257/784 |
| 2010/0171201 | A1 | 7/2010 | Wyant et al. | |
| 2010/0244214 | A1* | 9/2010 | Arita | H01L 23/49503 |
| | | | | 257/676 |
| 2012/0091570 | A1* | 4/2012 | Pan | H01L 21/568 |
| | | | | 257/676 |
| 2013/0020688 | A1* | 1/2013 | Pan | H01L 23/3107 |
| | | | | 257/676 |
| 2013/0168866 | A1* | 7/2013 | Prajuckamol | H01L 24/29 |
| | | | | 257/773 |
| 2014/0248747 | A1 | 9/2014 | Prajuckamol et al. | |
| 2016/0049567 | A1* | 2/2016 | Palaniswamy | H05K 1/189 |
| | | | | 257/98 |

FOREIGN PATENT DOCUMENTS

| | | |
|---|---|---|
| JP | H 06-089947 A | 3/1994 |
| JP | H9-129657 A | 5/1997 |
| JP | 09-283655 A | 10/1997 |
| JP | H10-163256 A | 6/1998 |
| JP | 2000-133762 A | 5/2000 |
| JP | 2002-124617 A | 4/2002 |
| JP | 2006-249415 A | 9/2006 |
| JP | 2007-235021 A | 9/2007 |
| JP | 2008-251786 A | 10/2008 |
| JP | 5210346 B2 | 6/2013 |
| JP | 5807340 B2 | 11/2015 |
| JP | 2019-102568 A | 6/2019 |
| WO | WO 2019/111778 A1 | 6/2019 |

* cited by examiner

US 11,769,714 B2

SEMICONDUCTOR DEVICE WITH SEMICONDUCTOR CHIP MOUNTED ON DIE PAD AND LEADS OF LEAD FRAME

CROSS-REFERENCE TO RELATED APPLICATION

This application is based upon and claims the benefit of priority from Japanese Patent Application No. 2020-150570, filed on Sep. 8, 2020, the entire contents of which are incorporated herein by reference.

FIELD

Embodiments described herein relate generally to a semiconductor device.

BACKGROUND

Power semiconductor chips designed for power control, such as metal-oxide-semiconductor field-effect transistors (MOSFET) and insulated gate bipolar transistors (IGBTs), have been developed for a wide range of fields including power generation and power transmission, rotating machines such as pumps and blowers, power supply devices such as communication systems and factories, railways using AC motors, electric vehicles, and home electric appliances.

Also, a semiconductor device as a power module using such a power semiconductor chip has been developed. Such a semiconductor device is required to have specifications such as high current density, low loss, and high heat dissipation.

DETAILED DESCRIPTION

Figure 1A:
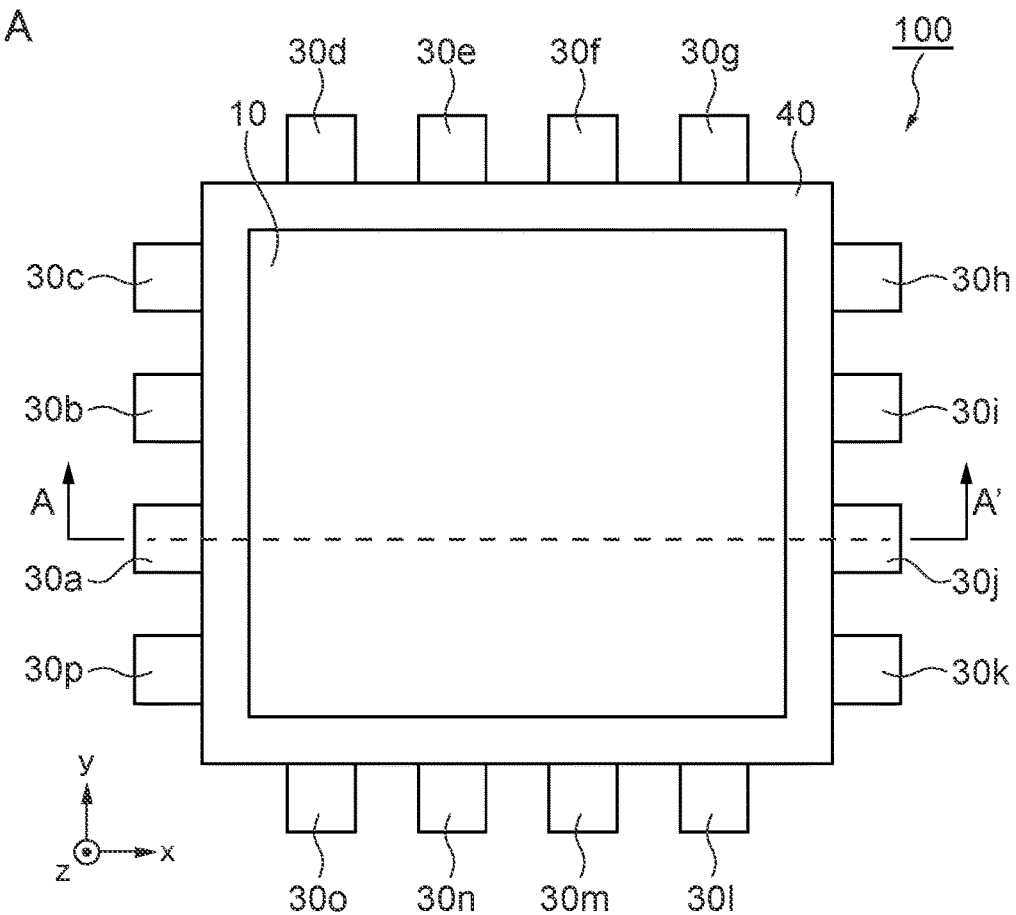
FIGS. 1A and 1B are schematic views of a semiconductor device according to a first embodiment.

Hereinafter, embodiments of the present disclosure will be described with reference to the drawings. In the following description, the same or similar members may be denoted by the same reference numerals. In addition, the description of members and the like once described may be omitted appropriately.

In the present specification, in order to indicate a positional relationship of components and the like, an upward direction in the drawings is described as "upper", and a downward direction in the drawings is described as "lower". In the present specification, the concepts of "upper" and "lower" are not necessarily terms indicating the relationship with the direction of gravity.

First Embodiment

A semiconductor device according to the present embodiment includes: a bed having a bed surface; a semiconductor chip having a bottom surface larger than the bed surface, the semiconductor chip being provided such that a center of the bottom surface is disposed above the bed surface and the bottom surface having a first end and a second end; a joint material provided between the bed surface and the bottom surface; a plate-like first wire having a first surface and provided such that the first surface faces the first end; a plate-like second wire having a second surface and provided such that the second surface faces the second end; a first insulating film having a third surface and a fourth surface provided on an opposite side of the third surface, the third surface being in contact with the first end, the fourth surface being in contact with the first surface; and a second insulating film having a fifth surface and a sixth surface provided on an opposite side of the fifth surface, the fifth surface being in contact with the second end, the sixth surface being in contact with the first surface.

Figure 1B:
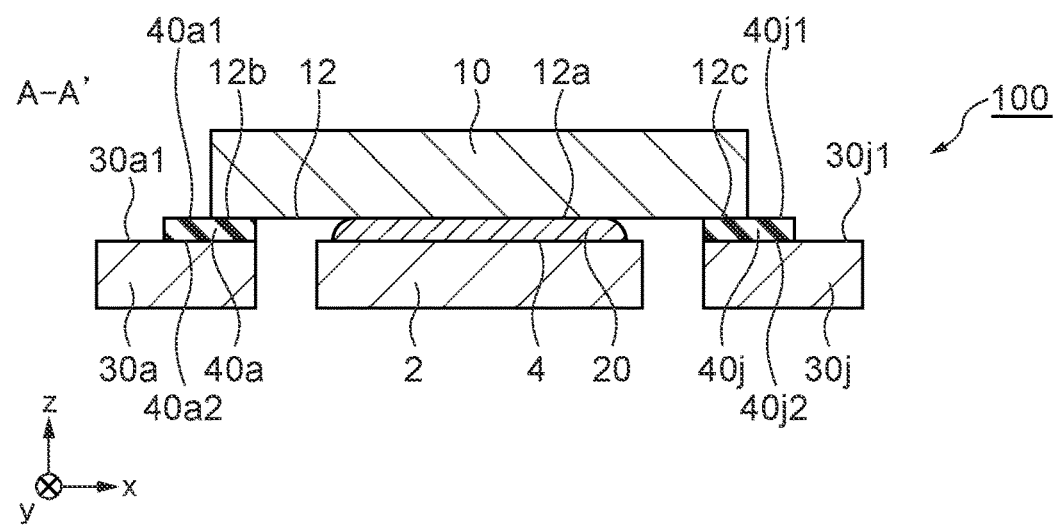

FIGS. 1A and 1B are schematic views of a semiconductor device 100 according to the present embodiment. FIG. 1A is a schematic top view of the semiconductor device 100 according to the present embodiment. FIG. 1B is a schematic cross-sectional view of the semiconductor device 100 of the present embodiment taken along line A-A' of FIG. 1A.

The semiconductor device 100 includes a bed 2, a semiconductor chip 10, a joint material 20, wires 30, and an insulating film 40.

The bed 2 is formed of, for example, a metal material such as copper (Cu) or an alloy. The bed 2 has a bed surface 4 on its upper surface. A thin film containing, for example, gold (Au), platinum (Pt), palladium (Pd), silver (Ag), copper (Cu), tin (Sn), nickel (Ni), or the like may be provided on the surface of the bed surface 4.

Here, an X direction, a Y direction perpendicular to the X direction, and a Z direction perpendicular to the X direction and the Y direction are defined. It is assumed that a bed surface 4 of a bed 2 to be described later is disposed in parallel with an XY plane.

The semiconductor chip 10 is, for example, a vertical Si-IGBT using silicon (Si). Note that the semiconductor chip 10 may be a Si-metal-oxide silicon field-effect transmitter (MOSFET), a Si-fast recovery diode (FRD), a SiC-IGBT insulated-gate bipolar transistor (IGBT) using silicon carbide (SiC), a SiC-MOSFET, a SiC-Schottky barrier diode (SBD), a GaN-MOSFET using a nitride semiconductor in which a group V element is nitrogen in a group III-V semiconductor, or the like. The semiconductor chip 10 may not be a so-called power semiconductor chip.

The semiconductor chip 10 has a bottom surface 12 larger than the bed surface 4 in at least one direction. The semiconductor chip 10 is provided such that the center 12a of the bottom surface is disposed above (on) the bed surface 4. The bottom surface 12 is, for example, a chip surface of the semiconductor chip 10.

The joint material 20 is provided between the bed surface 4 and the bottom surface 12 of the semiconductor chip. The joint material 20 joins the bed surface 4 and the bottom surface 12 of the semiconductor chip.

The joint material 20 joins the bed surface 4 and the semiconductor chip 10 together. Joint material 20 includes, for example, die attach (DA) paste. The die attachment paste contains, for example, a sintered material containing a predetermined metal material, and a predetermined resin. The joint material 20 is formed by thermally treating a paste that contains metal particles containing the predetermined metal material, the predetermined resin, and a predetermined solvent such as a polar solvent, evaporating the predetermined solvent, and sintering the metal particles. The joint material 20 has electrical conductivity and electrically connects the bottom surface 12 of the semiconductor chip and an external electric circuit (not illustrated) of the semiconductor device 100 via the bed 2 and the joint material 20.

The predetermined metal material is not particularly limited, but for example, Au, Pt, Pd, Ru (ruthenium), Rh (rhodium), Ir (iridium), Ag (silver), Cu (copper), Ni (nickel), Zn (zinc), Bi (bismuth), Fe (iron), Mo (molybdenum), Al (aluminum), Cr (chromium), V (vanadium), or the like is preferably used. As the predetermined metal material, Ag, Cu, or Au is particularly preferably used because of its high thermal conductivity and electrical conductivity.

The predetermined resin is not particularly limited, but for example, a polyethylene resin, a polypropylene resin, a vinyl chloride resin, a polystyrene resin, an acrylonitrile styrene resin, an ABS resin, a polyethylene terephthalate resin, a methacrylic resin, a polyvinyl alcohol resin, a vinylidene chloride resin, a polycarbonate resin, a polyamide resin, an acetal resin, a polybutylene terephthalate resin, a fluororesin, a phenol resin, a melamine resin, a urea resin, a polyurethane resin, an epoxy-based resin, an unsaturated polyester resin, or the like is preferably used. As the predetermined resin, an epoxy-based resin is particularly preferably used.

A sintering paste is an example of die attachment paste and is preferably used in the semiconductor device 100 of the present embodiment. A silver paste is a die attachment paste using Ag for a predetermined metal material and is preferably used in the semiconductor device of the present embodiment.

As illustrated in FIG. 1A, a plurality of wires 30 is provided around the semiconductor chip 10 when viewed from above the semiconductor chip 10. The plurality of wires 30 is formed of, for example, a metal such as Cu (copper) or an alloy. The plurality of wires 30 are electrically connected to an electrode (not illustrated) provided on the upper surface of the semiconductor chip 10 using wires (not illustrated) or the like, for example.

FIG. 1A illustrates wires 30a, 30b, 30c, 30d, 30e, 30f, 30g, 30h, 30i, 30j, 30k, 30l, 30m, 30n, 30o, and 30p as the plurality of wires 30. Each wire 30 has a plate-like shape. The surface of each wire 30 is provided to face the end of the bottom surface 12 of the semiconductor chip. In other words, a part of the wire 30 is provided below the bottom surface 12 of the semiconductor chip. The wire 30a and the wire 30j will be described as an example with reference to FIG. 1B. The wire 30a (an example of a first wire) has an upper surface $30a_1$ (an example of a first surface). The upper surface $30a_1$ is provided to face an end 12b (an example of a first end) of the bottom surface 12 of the semiconductor chip. The wire 30j (an example of a second wire) has an upper surface $30j_1$ (an example of a second surface). The upper surface $30j_1$ is provided to face an end 12c (an example of a second end) of the bottom surface 12 of the semiconductor chip. Note that the number of the plurality of wires 30 is not limited to that illustrated in FIG. 1A.

As illustrated in FIG. 1A, the insulating film 40 (an example of a third insulating film) is provided to surround the semiconductor chip 10 when viewed from above the semiconductor chip 10 and is provided between the semiconductor chip 10 and the plurality of wires 30. Note that the shape of the insulating film 40 when viewed from above the semiconductor chip 10 is not limited to that illustrated in FIG. 1A.

The insulating film 40 preferably contains polyimide. For example, the insulating film 40 is Kapton (registered trademark) having a withstand voltage of 400 kV·mm$^{-1}$. Furthermore, the film thickness of the insulating film 40 is preferably, for example, 25 μm or more.

As illustrated in FIG. 1B, an insulating film 40a (an example of a first insulating film), which is a part of the insulating film 40, has an upper surface $40a_1$ (an example of a third surface) in contact with end 12b of the bottom surface 12 and has a lower surface $40a_2$ (an example of a fourth surface) in contact with the upper surface $30a_1$. The insulating film 40a is joined to each of the end 12b and the upper surface $30a_1$.

Further, as illustrated in FIG. 1B, an insulating film 40j (an example of a second insulating film), which is a part of the insulating film 40, has an upper surface $40j_1$ (an example of a fifth surface) in contact with end 12c of the bottom surface 12 and has a lower surface $40j_2$ (an example of a sixth surface) in contact with the upper surface $30j_1$. The insulating film 40j is joined to each of the end 12c and the upper surface $30j_1$.

For example, a sealing resin (not illustrated) is provided around the bed 2, the semiconductor chip 10, and the joint material 20.

In the Z direction, the height of the bed surface 4, the height of the upper surface $30a_1$ of the wire 30a, and the height of the upper surface $30j_1$ of the wire 30j are preferably equal to each other. Furthermore, in the Z direction, the height of the bed surface 4, the height of the upper surface of the wire 30b, the height of the upper surface of the wire 30c, the height of the upper surface of the wire 30d, the height of the upper surface of the wire 30e, the height of the upper surface of the wire 30f, the height of the upper surface of the wire 30g, the height of the upper surface of the wire 30h, the height of the upper surface of the wire 30i, the height of the upper surface of the wire 30k, the height of the upper surface of the wire 30l, the height of the upper surface of the wire 30m, the height of the upper surface of the wire 30n, the height of the upper surface of the wire 30o, and the height of the upper surface of the wire 30p are preferably equal to each other.

Next, the functions and effects of the semiconductor device 100 according to the present embodiment will be described.

For reducing the size of the semiconductor device 100, it is preferable to shorten the distance between the semiconductor chip 10 and the wire 30 in a plane parallel to the XY plane. For example, when the bed surface 4 is reduced to make the semiconductor chip 10 mountable on the wire 30, the ratio of the area occupied by the semiconductor chip 10 in the semiconductor device 100 increases, and the size reduction is realized.

Figure 2:
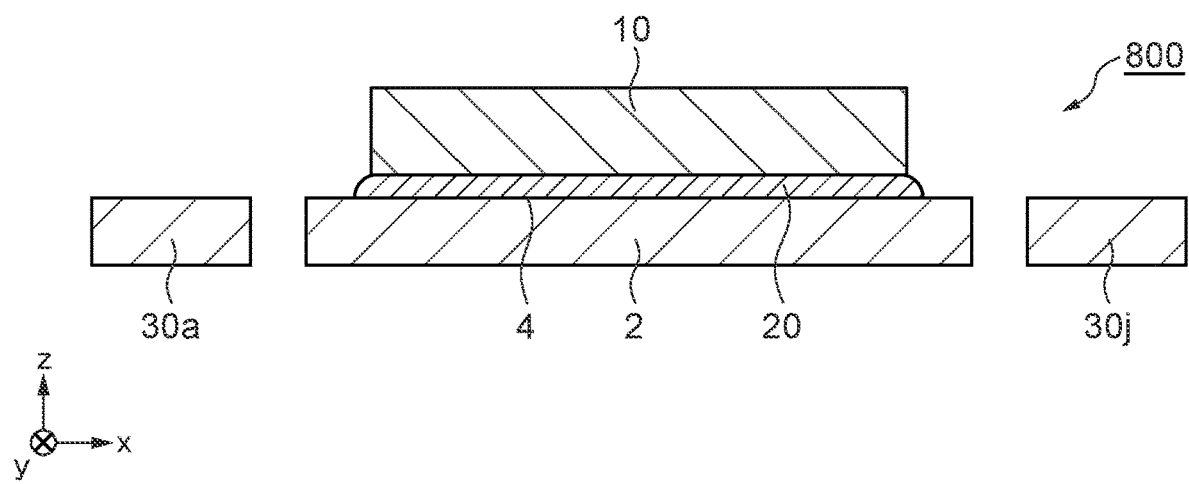
FIG. 2 is a schematic cross-sectional view of a semiconductor device according to a first comparative embodiment of the first embodiment.

FIG. 2 is a schematic cross-sectional view of a semiconductor device 800 according to a first comparative embodiment of the present embodiment. In the semiconductor device 800, unlike the semiconductor device 100, the wire 30a and the wire 30j are not provided below the semiconductor chip 10 because the bed surface 4 is large. Thus, the size reduction is difficult in the structure of the semiconductor device 800.

Figure 3:
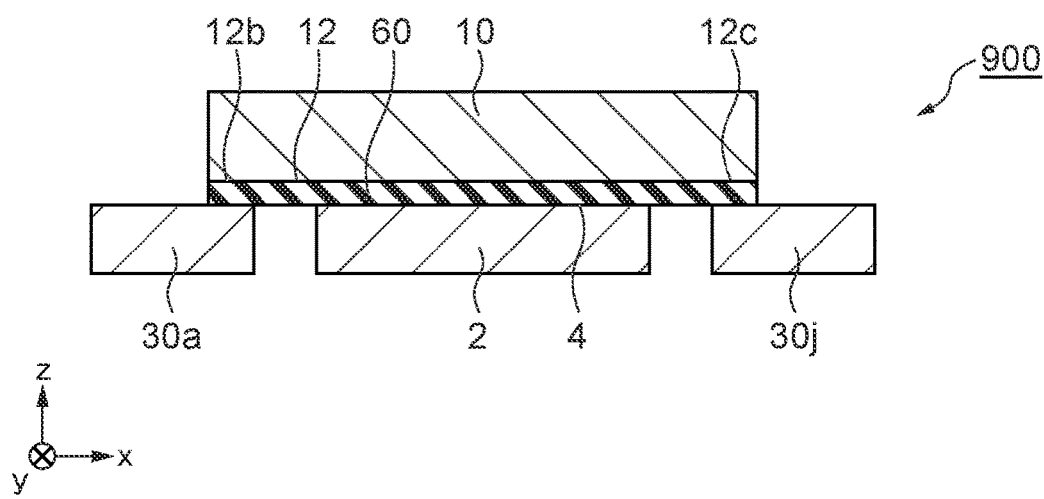
FIG. 3 is a schematic cross-sectional view of a semiconductor device according to a second comparative embodiment of the first embodiment.

FIG. 3 is a schematic cross-sectional view of a semiconductor device 900 according to a second comparative embodiment of the present embodiment. In the semiconductor device 900, an insulating film 60 has been made to adhere to the bottom surface 12 of the semiconductor chip 10. The insulating film 60 is, for example, a die attach film (DAF). The wire 30a and the wire 30j are provided below the end 12b and the end 12c of the bottom surface 12 of the semiconductor chip via the insulating film 60. In addition, the semiconductor chip 10 is provided on the bed 2 via the insulating film 60. With this structure, the semiconductor device can be reduced in size. However, in a case where the semiconductor chip 10 is a power semiconductor chip, since a large voltage is applied to the semiconductor device 900, the insulating film 60 cannot ensure the insulation between the wire 30 and the semiconductor chip 10, which has been problematic. In addition, there has been a problem that a die attach film used as the insulating film 60 cannot ensure high reliability.

Therefore, in the semiconductor device 100 of the present embodiment, the upper surface $30a_1$ of the wire 30a is provided to face the end 12b of the bottom surface 12 of the semiconductor chip. The upper surface $30j_1$ of the wire 30j is provided to face the end 12c of the bottom surface 12 of the semiconductor chip. The insulating film 40a has the upper surface $40a_1$ in contact with the end 12b of the bottom surface 12 and has the lower surface $40a_2$ in contact with the upper surface $30a_1$. The insulating film 40j has the upper surface $40j_1$ in contact with the end 12c of the bottom surface 12 and has the lower surface $40j_2$ in contact with the upper surface $30j_1$. The joint material 20 is provided between the bed surface 4 and the bottom surface 12 of the semiconductor chip.

The joint material 20 is provided between the bottom surface 12 of the semiconductor chip and the bed 2. The joint material 20 generally has higher reliability than the die attach film. Then, a part of the wire 30 is provided below the bottom surface 12 of the semiconductor chip by using the insulating film 40. It is thereby possible to provide the semiconductor device 100 reduced in size.

In addition, the height of the bed surface 4, the height of the upper surface $30a_1$ of the wire 30a, and the height of the upper surface $30j_1$ of the wire 30j are preferably equal to each other. This is because, since the semiconductor chip 10 is stably disposed on the bed 2 with the insulating film 40, a stable film thickness of the joint material 20 is ensured, and higher reliability can be maintained in a more stable manner.

The joint material 20 preferably contains the die attachment paste. The joint material 20 preferably contains the silver paste or the sintering paste. This is to achieve stable reliability.

The insulating film 40 preferably contains polyimide. This is because the insulating film 40 has high insulation. In addition, the film thickness of the insulating film 40 is preferably 25 μm or more. The thicker the insulating film 40 is, the higher withstand voltage can be ensured. This is because, for example, in a case where Kapton (registered trademark) having a withstand voltage of 400 kV·mm$^{-1}$ is used as the insulating film 40, when the film thickness is 25 μm or more, a withstand voltage of 10 kV can be ensured.

In a case where the insulating film 40 and the semiconductor chip 10 are misaligned, the misalignment can be easily recognized when the semiconductor device 100 is viewed from above, so that a defective product can be easily determined.

According to the semiconductor device 100 of the present embodiment, it is possible to provide a semiconductor device reduced in size.

Second Embodiment

The semiconductor device of the present embodiment is different from the semiconductor device of the first embodiment in that the first insulating film and the second insulating film each include a solder resist. Here, a description overlapping the description of the semiconductor device of the first embodiment will be omitted.

Figure 4A:
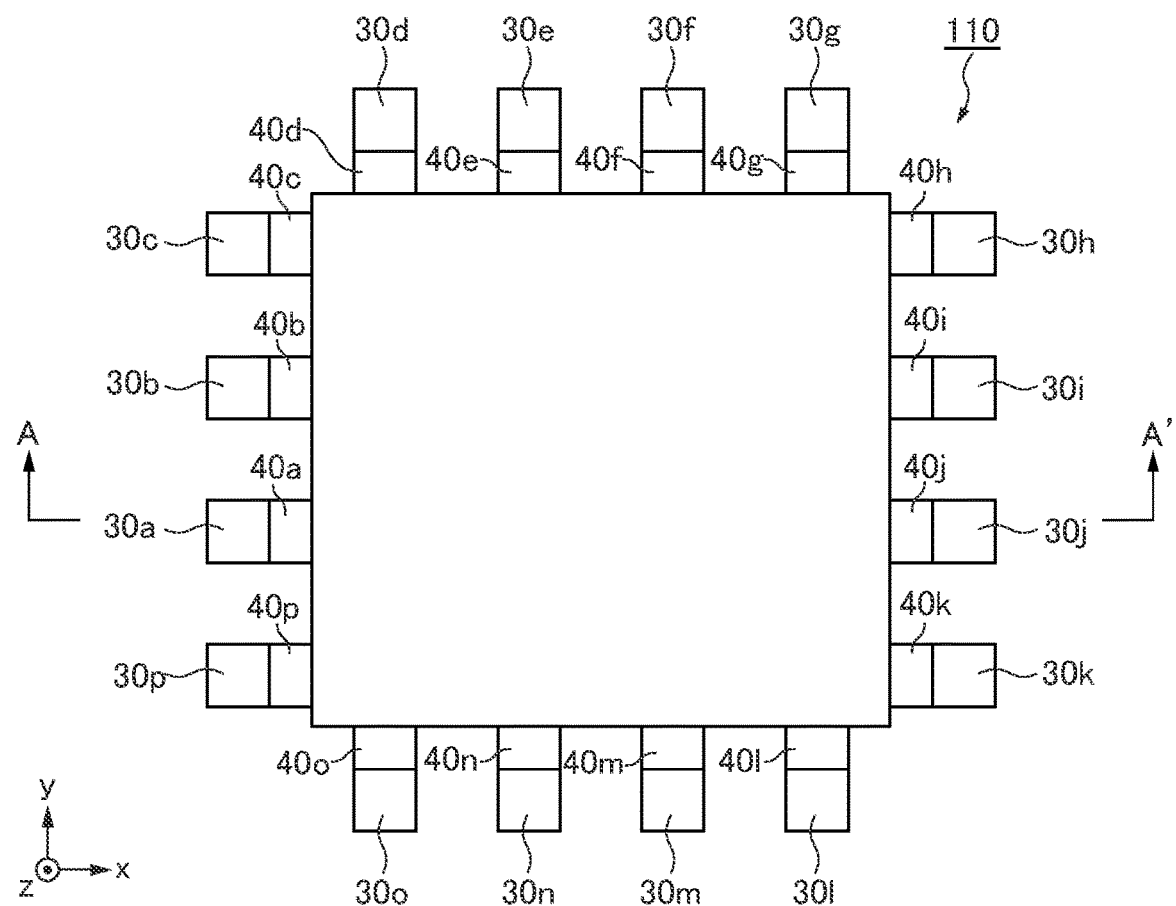
FIGS. 4A and 4B are schematic views of a semiconductor device according to a second embodiment.
Figure 4B:
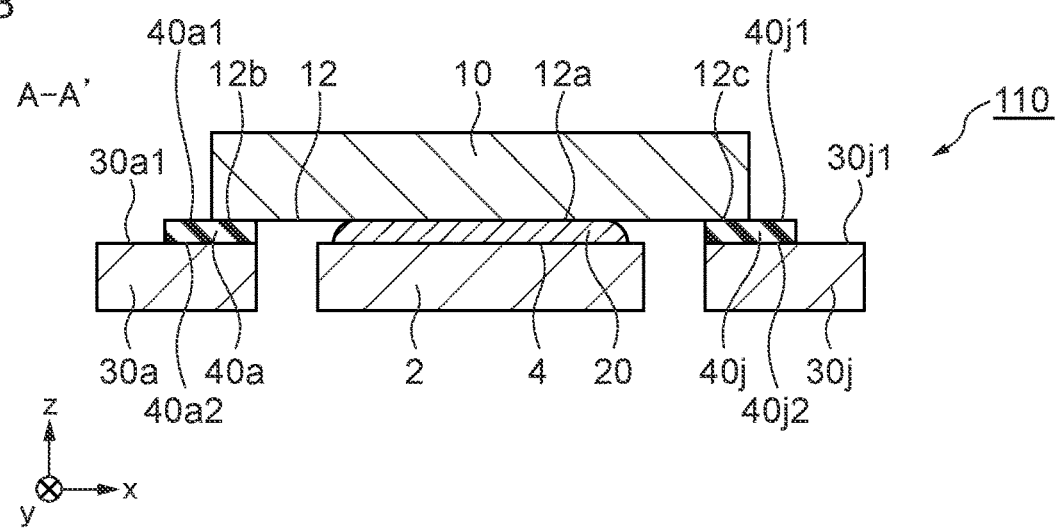

FIGS. 4A and 4B are schematic views of a semiconductor device 110 according to the present embodiment. FIG. 4A is a schematic top view of the semiconductor device 110 according to the present embodiment. FIG. 4B is a schematic cross-sectional view of the semiconductor device 110 of the present embodiment taken along line A-A' of FIG. 4A.

A solder resist is used as the insulating film 40. A solder resist is applied onto each wire 30 and dried to form the insulating film 40. Specifically, an insulating film 40a is provided on the wire 30a, an insulating film 40b on the wire 30b, an insulating film 40c on the wire 30c, an insulating film 40d on the wire 30d, an insulating film 40e on the wire 30e, an insulating film 40f on the wire 30f, an insulating film 40g on the wire 30g, an insulating film 40h on the wire 30h, an insulating film 40i on the wire 30i, an insulating film 40j on the wire 30j, an insulating film 40k on the wire 30k, an insulating film 40l on the wire 30l, an insulating film 40m on the wire 30m, an insulating film 40n on the wire 30n, and an insulating film 40o on the wire 30o. For example, a solder resist having a film thickness of 20 μm and capable of ensuring a withstand voltage of 1.2 kV is preferably used as the insulating film 40.

In the semiconductor device 110 of the present embodiment as well, it is possible to provide a semiconductor device reduced in size.

Third Embodiment

The semiconductor device of the present embodiment is different from the semiconductor devices of the first and second embodiments in that an insulating film 50 is provided between the bed surface 4 and the bottom surface 12. Here, the description of points of difference from the semiconductor devices of the first and second embodiments will be omitted.

Figure 5:
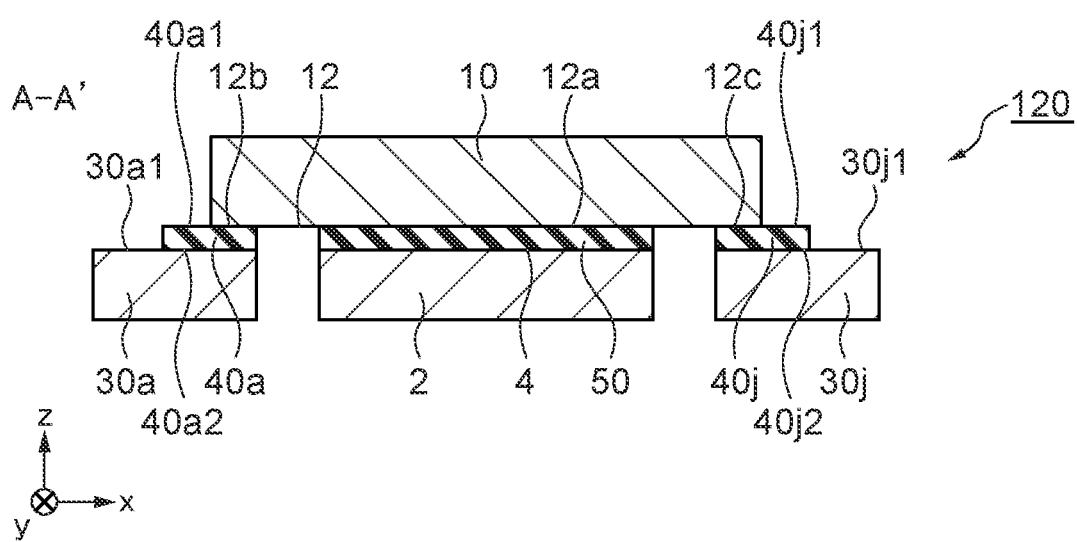
FIG. 5 is a schematic cross-sectional view of a semiconductor device according to a third embodiment.

FIG. 5 is a schematic cross-sectional view of a semiconductor device 120 according to the present embodiment. As the insulating film 50, for example, the polyimide used in the semiconductor device 100 of the first embodiment or the solder resist used in the semiconductor device 110 of the second embodiment is preferably used. Needless to say, the type of the insulating film 50 is not limited thereto.

The semiconductor device 120 according to the present embodiment can also provide a semiconductor device reduced in size.

While certain embodiments have been described, these embodiments have been presented by way of example only, and are not intended to limit the scope of the inventions. Indeed, a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a bed having a bed surface;
   a semiconductor chip having a bottom surface larger than the bed surface, the semiconductor chip being provided such that a center of the bottom surface is disposed above the bed surface and the bottom surface having a first end and a second end;
   a joint material provided between the bed surface and the bottom surface;

a plate-like first wire having a first surface and provided such that the first surface faces the first end;

a plate-like second wire having a second surface and provided such that the second surface faces the second end;

a first insulating film having a third surface and a fourth surface provided on an opposite side of the third surface, the third surface being in contact with the first end, the fourth surface being in contact with the first surface;

a second insulating film having a fifth surface and a sixth surface provided on an opposite side of the fifth surface, the fifth surface being in contact with the second end, the sixth surface being in contact with the first surface; and a third insulating film including the first insulating film and the second insulating film, wherein the first insulating film and the second insulating film comprise polyimide, and wherein the third insulating film is provided to surround the semiconductor chip when viewed from above the semiconductor chip.

2. The semiconductor device according to claim 1, wherein a height of the bed surface, a height of an upper surface of the first wire, and a height of an upper surface of the second wire are equal to each other.

3. The semiconductor device according to claim 1, wherein the joint material has electrical conductivity.

4. The semiconductor device according to claim 1, wherein the joint material includes a die attachment paste.

5. The semiconductor device according to claim 4, wherein the die attachment paste comprises a silver paste or a sintering paste.

6. The semiconductor device according to claim 4, wherein the die attachment paste includes a sintered material comprising a predetermined metal material, and a predetermined resin.

7. The semiconductor device according to claim 1, wherein a film thickness of the first insulating film and a film thickness of the second insulating film are 25 µm or more.

8. The semiconductor device according to claim 1, wherein the first insulating film and the second insulating film include solder resist.

9. The semiconductor device according to claim 8, wherein the first insulating film is provided apart from the second insulating film.

10. A semiconductor device comprising:
a bed having a bed surface;
a semiconductor chip having a bottom surface larger than the bed surface, the semiconductor chip being provided such that a center of the bottom surface is disposed above the bed surface and the bottom surface having a first end and a second end;
a joint material provided between the bed surface and the bottom surface;
a plate-like first wire having a first surface and provided such that the first surface faces the first end;
a plate-like second wire having a second surface and provided such that the second surface faces the second end;
a first insulating film having a third surface and a fourth surface provided on an opposite side of the third surface, the third surface being in contact with the first end, the fourth surface being in contact with the first surface; and
a second insulating film having a fifth surface and a sixth surface provided on an opposite side of the fifth surface, the fifth surface being in contact with the second end, the sixth surface being in contact with the first surface, wherein the first insulating film and the second insulating film include solder resist.

11. The semiconductor device according to claim 10, wherein a height of the bed surface, a height of an upper surface of the first wire, and a height of an upper surface of the second wire are equal to each other.

12. The semiconductor device according to claim 10, wherein the joint material has electrical conductivity.

13. The semiconductor device according to claim 10, wherein the joint material includes a die attachment paste.

14. The semiconductor device according to claim 13, wherein the die attachment paste comprises a silver paste or a sintering paste.

15. The semiconductor device according to claim 13, wherein the die attachment paste includes a sintered material comprising a predetermined metal material, and a predetermined resin.

16. The semiconductor device according to claim 10, wherein the first insulating film and the second insulating film comprise polyimide.

17. A semiconductor device comprising:
a bed having a bed surface;
a semiconductor chip having a bottom surface larger than the bed surface, the semiconductor chip being provided such that a center of the bottom surface is disposed above the bed surface and the bottom surface having a first end and a second end;
a joint material provided between the bed surface and the bottom surface;
a plate-like first wire having a first surface and provided such that the first surface faces the first end;
a plate-like second wire having a second surface and provided such that the second surface faces the second end;
a first insulating film having a third surface and a fourth surface provided on an opposite side of the third surface, the third surface being in contact with the first end, the fourth surface being in contact with the first surface; and
a second insulating film having a fifth surface and a sixth surface provided on an opposite side of the fifth surface, the fifth surface being in contact with the second end, the sixth surface being in contact with the first surface, wherein a film thickness of the first insulating film and a film thickness of the second insulating film are 25 µm or more.

18. The semiconductor device according to claim 17, wherein a height of the bed surface, a height of an upper surface of the first wire, and a height of an upper surface of the second wire are equal to each other.

19. The semiconductor device according to claim 17, wherein the joint material has electrical conductivity.

20. The semiconductor device according to claim 17, wherein the joint material includes a die attachment paste.

21. The semiconductor device according to claim 20, wherein the die attachment paste comprises a silver paste or a sintering paste.

22. The semiconductor device according to claim 20, wherein the die attachment paste includes a sintered material comprising a predetermined metal material, and a predetermined resin.

* * * * *